United States Patent [19]

Hansen et al.

[11] Patent Number: 4,849,371

[45] Date of Patent: Jul. 18, 1989

[54] MONOCRYSTALLINE SEMICONDUCTOR BURIED LAYERS FOR ELECTRICAL CONTACTS TO SEMICONDUCTOR DEVICES

[75] Inventors: Kent W. Hansen; Frank S. D'Aragona; Hang M. Liaw, all of Scottsdale, Ariz.

[73] Assignee: Motorola Inc., Schaumburg, Ill.

[21] Appl. No.: 271,359

[22] Filed: Nov. 15, 1988

Related U.S. Application Data

[63] Continuation of Ser. No. 133,257, Dec. 14, 1987, abandoned, which is a continuation-in-part of Ser. No. 944,730, Dec. 22, 1986, abandoned.

[51] Int. Cl.$^4$ .......................................... H01L 21/265
[52] U.S. Cl. ........................................ 437/82; 437/31; 437/131; 437/89; 437/90; 437/203; 437/174; 437/248; 437/234; 148/DIG. 11; 357/34
[58] Field of Search ................... 437/81, 82, 203, 233, 437/234, 247, 248, 173, 174, 31, 32, 33, 131, 126, 89, 90; 148/DIG. 10, DIG. 11, DIG. 58; 357/34

[56] References Cited

U.S. PATENT DOCUMENTS

| | | | |
|---|---|---|---|
| 4,343,832 | 8/1982 | Smith et al. | 427/53.1 |
| 4,377,031 | 3/1983 | Goto et al. | 29/576 |
| 4,377,421 | 3/1983 | Wada et al. | 148/1.5 |
| 4,442,449 | 4/1984 | Lehrer et al. | 148/33.1 |
| 4,497,665 | 2/1985 | Fukuda | 156/647 |
| 4,498,951 | 2/1985 | Tamura et al. | 156/612 |
| 4,500,388 | 2/1985 | Ohmura et al. | 156/603 |
| 4,551,394 | 11/1985 | Betsch et al. | 437/131 |
| 4,569,700 | 2/1986 | Toyama | 148/174 |
| 4,585,493 | 4/1986 | Anthony | 148/171 |
| 4,590,130 | 5/1986 | Cline . | |
| 4,663,831 | 5/1987 | Birrittella et al. | 29/576 |
| 4,696,097 | 9/1987 | McLaughlin et al. | 437/193 |

FOREIGN PATENT DOCUMENTS

| | | | |
|---|---|---|---|
| 3400295 | 7/1984 | Fed. Rep. of Germany . | |
| 0056405 | 4/1983 | Japan | 437/131 |

OTHER PUBLICATIONS

T. I. Kamins, "Silicon Integrated Circuits Using Beam-Recrystallized Polysilicon", Hewlett-Packard Journal, Aug. 1982, pp. 10-13.

M. Haond et al., "Microanalysis of Single-Crystal Si Recrystallized Using Halogen Lamps", J. Appl. Phys., vol. 54(7), Jul. 1983, pp. 3892-3896.

M. W. Geis et al., "Zone-Melting Recrystallization of Si Films with a Moveable-Strip-Heater Oven", J. Electrochem. Soc.: Solid-State Science & Technology, Dec. 1982, pp. 2812-2818.

H. I. Smith et al., "The Mechanism of Orientation of Si Graphoepitaxy by Laser or Strip Heater Recrystallization", J. Electrochem. Soc.: Solid-State Science & Technology, vol. 130, No. 10, Oct. 1983, pp. 2050-2053.

L. Jastrzebski, "Comparison of Different SOI Technologies: Assets and Liabilities", RCA Review, vol. 44, Jun. 1983, pp. 250-269.

J. C. C. Fan et al., "Graphite-Strip-Heater Zone-Melting Recrystallization of Si Films", Journal of Crystal Growth, vol. 63 (1983), pp. 453-483, North-Holland Publishing Company.

T. Nakamura et al., "Self Aligned Transistor with Sidewall Base Electrode", IEEE Transactions on Electron Devices, vol. ED-29, No. 4, Apr. 1982, pp. 596-600.

N. Oh-uchi et al., "A New Self-Aligned Transistor Structure for High Speed and Low-Power Bipolar LSI's", Proceedings IEDM '83, IEEE Electron Devices Section, 1983, pp. 55-57 (3.3).

H. Sakurai et al., "A New Transistor Structure for High Speed Bipolar LSI", Proc. 11th International Solid State Device Conference, Tokyo, 1979, Japanese Journal of Applied Physics, vol. 19 (1980), Suppl. 19-1, pp. 181-185.

D. D. Tang et al., "A Symmetrical Bipolar Structure", Proceedings IEDM '80, IEEE Electron Devices Section, 1980, pp. (3.4) 58-60.

J. N. Burghartz et al., "Selective Epitaxy Base Transistor (SEBT)", IEEE Electron Device Letters, vol. 9, No. 5, May 1988, pp. 259-261.

Primary Examiner—Brian E. Hearn
Assistant Examiner—Kevin McAndrews
Attorney, Agent, or Firm—Robert M. Handy; Joe E. Barbee

[57] ABSTRACT

A method and product for monocrystalline semiconductor buried layer contacts formed from recrystallized polycrystalline buried layers.

10 Claims, 1 Drawing Sheet

MONOCRYSTALLINE SEMICONDUCTOR BURIED LAYERS FOR ELECTRICAL CONTACTS TO SEMICONDUCTOR DEVICES

This application is a continuation of prior application Ser. No. 07/133,257, filed Dec. 14, 1987, now abandoned, which is a Continuation-In-Part of prior application Ser. No. 06/944,730, filed Dec. 22, 1986, now abandoned.

BACKGROUND OF THE INVENTION

This invention relates in general to electronic devices and, more particularly, to improved means and methods for providing small high performance devices with sidewall contacts, suitable for use in large scale integrated circuits.

There is an ongoing desire in the semiconductor art to produce transistors having smaller and smaller dimensions. This is because, in many applications faster performance, lower power dissipation and/or more complex circuits can be obtained with smaller devices. This desired has lead to the development of bipolar "pillar" devices. These devices require buried layer conductors which act as sidewall contacts to base and/or collector. Pillar transistors and methods therefor are described, for example, in U.S. Pat. Nos. 4,663,831 and 4,696,097 which are incorporated herein by reference.

High speed operation of semiconductor devices is limited by the resistance of the conducting paths and extrinsic capacitance in the devices. "Pillar" devices such as pedestal-type bipolar transistors have been proposed to improve these limitations. The proposed pedestal bipolar transistors use either doped polycrystalline silicon or a refractory metal for the sidewall contacts.

To fabricate a pedestal transistor a well or groove is formed. This well is defined by sidewalls which are made of multilayers of materials. Horizontal layers(s) of polycrystalline silicon or refractory metal act as sidewall contacts. The well is then filled by the selective epitaxial silicon. During the epitaxial growth of silicon, nucleation of polycrystalline silicon at the sidewall of the well can inevitably occur. The silicon nuclei grows as epitaxial silicon and results in polysilicon bumps surrounding the edges of the device. This creates nonplanarity in the surface of the wafer which is undesirable for integrated circuit applications. The polycrystalline silicon contact also has a high resistivity which slows the operating speed of a semiconductor device. The polysilicon may also extend into critical device regions within the pillar and thereby further degrade device performance.

While metal contacts have very low resistivity the silicon epitaxial layer can be contaminated by the metal when a refractory metal is used as a conducting path. The use of metal contacts can also degrade the device performance due to the lowering of minority carrier lifetime and increasing leakage currents.

SUMMARY OF THE INVENTION

In view of the foregoing, it is therefore an object of the present invention to provide new and improved sidewall contacts.

A further object of the present invention is to provide contacts with an improved electrical conductivity.

A further object of the present invention is to provide contacts which will not contaminate the silicon epitaxial layers and thus will not degrade the device performance.

Another object of the present invention is to provide contacts which will enhance high quality epitaxial growth which has a desirable effect on devices.

These and other objects of this invention will become apparent to those skilled in the art upon consideration of the accompanying specification, claims, and drawings.

The foregoing objects are achieved in the present invention wherein semiconductor devices such as pedestal transistors have buried layer contacts comprising layers of insulating material surrounding layers of monocrystalline semiconductor material.

Alternating layers of insulating material and polycrystalline semiconductor material are laid on a substrate. A well or trench is etched into these layers and extends from the substrate to an outer surface of the layers, with sidewalls substantially perpendicular to the polycrystalline layers. The polycrystalline layers are then recrystallized to form single crystal layers which act as sidewall contacts and conductor paths to a semiconductor device which is later formed in the well or trench. In a preferred embodiment, the polycrystalline sidewall contact layers are formed from a semiconductor material having a lower melting point than the semiconductor substrate.

BRIEF DESCRIPTION OF THE DRAWINGS

A more complete understanding of the present invention can be obtained by considering the following detailed description in conjunction with the accompanying drawings, in which:

FIGS. 6A-E illustrate a pillar transistor similar to that shown in FIGS. 2-5, at different stages of fabrication and according to further embodiments of the present invention.

DESCRIPTION OF THE PREFERRED EMBODIMENT

Figure 1:
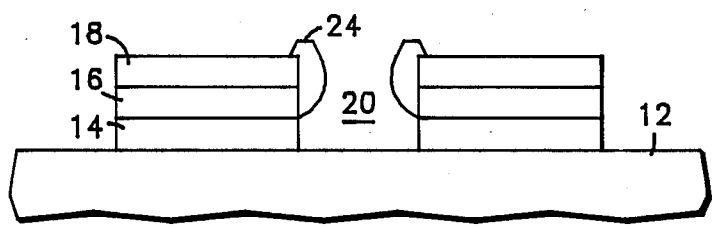
FIG. 1 is an enlarged fragmentary cross-sectional view of a buried layer contact in accordance with prior art.

FIG. 1 is a cross-sectional side view of a buried layer contact in the prior art. On substrate 12, alternating layers of oxide and polycrystalline semiconductor material are built up. The polycrystalline semiconductor material is usually silicon. First, an oxide layer 14 is formed on substrate 12. This is followed by a polycrystalline silicon layer 16 which is formed on the surface of layer 14. Layer 16 is then capped by an oxide layer 18 which is formed on its surface. A trench 20 is formed in the layers and extends from substrate 12 to the surface of the layers and has sidewalls substantially perpendicular to polycrystalline silicon layer 16. Into trench 20 a monocrystalline silicon material is epitaxially grown, using substrate 12 as a seed crystal, to produce a semiconductor device. During the epitaxial growth of the silicon in trench 20, nucleation 24 of polycrystalline silicon at the sidewall can occur when layer 16 is polycrystalline silicon. This is undesirable for integrated circuit applications.

Figure 2:
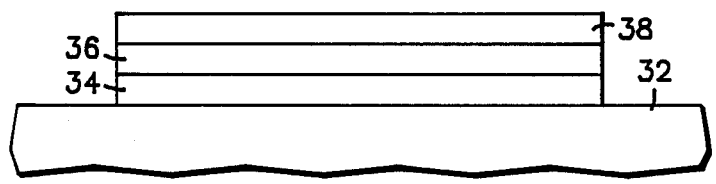
FIG. 2 and FIG. 3 are enlarged fragmentary cross-sectional views showing the steps involved in the fabrication of monocrystalline buried layer contacts.
Figure 3:
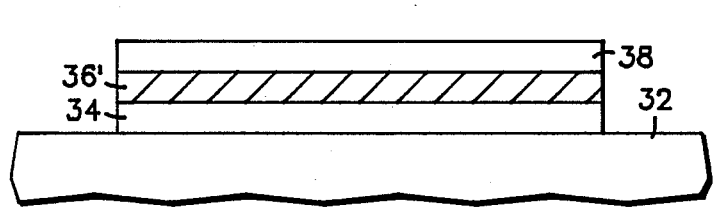

FIG. 2 and FIG. 3 show the development of monocrystalline semiconductor buried layer contacts. In FIG. 2 a substrate 32, which is a semiconductor material such as silicon, has an insulating layer such as an oxide, deposited thereon. A polycrystalline silicon layer 36 is deposited on the surface of oxide layer 34. While layer 36 is silicon in this embodiment it should be understood that any semiconductor material may be used. A second oxide layer 38 is then deposited on the surface of polycrystalline layer 36. It should be noted by those skilled in the art that many alternating layers of oxide material and polycrystalline silicon may be deposited.

When a silicon substrate is used, thermally grown silicon dioxide is convenient for dielectric layer 34. A thickness of about 0.4 micrometers is suitable for layer 34. Polylayer 36 is typically of silicon or germanium and of a thickness in the range 0.2–0.6 micrometers. Dielectric layer 38 is typically of silicon oxide or silicon oxide plus silicon nitride, of thickness in the range of about 0.03 micrometers for the nitride and about 0.2–0.4 micrometers for the oxide. Thicker or thinner layers may be used for layers 34, 36, 38 depending upon the desired series conductance and layer to layer or layer to substrate capacitance. Layers 34, 36, 38 are formed by means well known in the art. Other dielectrics or semiconductors may also be used.

When the alternating layers of oxide and polycrystalline silicon have been deposited, polycrystalline layer 36 is then recrystallized to form monocrystalline layer 36', as shown in FIG. 3. It has been found that a seed crystal is not necessary for the polycrystalline layer to be recrystallized into a monocrystalline layer 36' if the polycrystalline layer 36 is located between two oxide layers 34 and 38. Although the use of seed crystal is not necessary it may be convenient in some applications. The use of a remotely located window (not shown) extending through layer 34 so that part of layer 36 is in contact with substrate 12 to provide a seed region for layer 36 is well known in the art.

The polycrystalline to monocrystalline recrystallization process is conveniently carried out using a strip heater located above the polycrystalline layers and capping oxide. The strip heater is scanned slowly across the wafer as it lies on a temperature control block. The wafer heat input/output should be adjusted so that a temperature gradient exists from the outer surface of the capping oxide to the substrate so that the poly layer or layers are above their melting point while the substrate is below the melting point (e.g., 1412° C. for silicon). Recrystallization of a polysilicon layer can be accomplished using a strip heater technique or other heating techniques well known in the art. See, for example, the article by John C. Fan et al, entitled "Graphite-Strip-Heater Zone-Melting Recrystallization of Si Films", *Journal of Crystal Growth,* Vol. 63, No. 3, October 1983, pages 453–483, North Holland Publishing Company, and the article by L. Jastrzebski, entitled "Comparison of Different SOI Technologies: Assets and Liabilities", *RCA Review,* Vol. 44, June 1983, pages 250–269.

After recrystallization the polycrystalline silicon becomes monocrystalline silicon which may contain subgrain boundaries. The subgrain boundaries do not degrade the electrical performance of the material for contact purposes. A plurality of layers of polycrystalline silicon may be recrystallized simultaneously using the strip heater technique. Those of skill in the art will appreciate based on the description herein that the rate of scan and the strip heater temperature are adjusted depending upon the thickness and number of the polycrystalline layers and the oxide layers.

Figure 4:
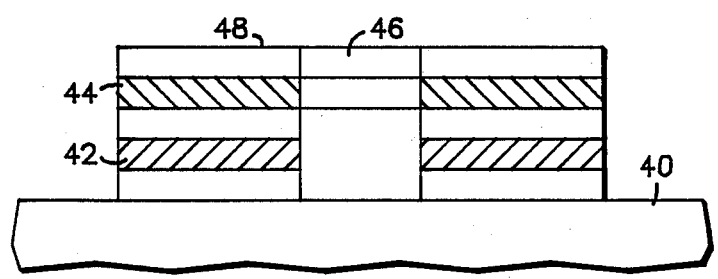
FIG. 4 is an enlarged fragmentary cross-sectional view showing monocrystalline buried layer contacts with the addition of a semiconductor device.

FIG. 4 shows two monocrystalline buried layer contacts 42 and 44 with a trench or well 46 etched therethrough. Well 46 extends from the surface of substrate 40 to the surface 48 of the alernating layers with sidewalls substantially perpendicular to monocrystalline layers 42 and 44. Monocrystallline silicon material 47 is epitaxially formed in well 46 to produce a region suitable for a semiconductor device. Monocrystalline layers 42 and 44 contact the semiconductor device region 47 and act as sidewall contacts. When the semiconductor device is epitaxially grown in trench 46, additional polycrystalline material is not nucleated by monocrystalline layers 42 and 44 as happened in well 20 of FIG. 1. Thus, no polycrystalline bumps form on the surface of sidewalls and device performance is improved.

Figure 5:
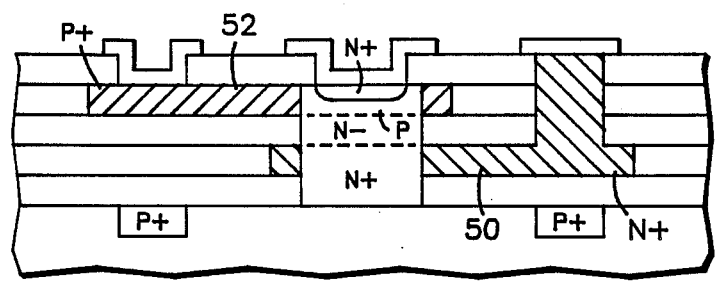
FIG. 5 illustrates a semiconductor device with two buried layer contacts.

FIG. 5 shows a cross-sectional side view of a completed semiconductor device with buried layer monocrystalline silicon contacts. This is an illustration of a semiconductor device with two buried layer contacts 50 and 52. To increase conductivity buried layer contacts 50 and 52 were formed by using doped polysilicon material. Layers 50 and 52 were then recrystallized to form doped monocrystalline silicon contacts. The polycrystalline layers 50 and 52 were formed consistent with technique in prior art.

The use of monocrystalline silicon in place of polycrystalline silicon for contacts, lowers the resistivity of the conducting path. It has been found that the sheet resistance for N-type doping is in the range of 7–24 ohms/square, and P-type doping is in the range 2–16 ohms/square when the thickness of the layer is varied from 2000–6000 angstroms. This resistivity range is much better than polycrystalline contacts which for N-type doping is 163–186 ohms/square and 159 ohms/square for P-type doping. There is thus provided by the present invention a substantially improved sidewall contact for semiconductor devices.

It has also been shown that monocrystalline contacts have a much improved electrical conductivity over polycrystalline contacts. The tendency to grow polycrystalline silicon along the sidewalls and top of semiconductor devices has also been reduced. And without the use of refractory metals, the contamination of silicon epitaxial layers has been reduced which will increase the lifetime and performance of the device.

Having thus described the invention it will be apparent to those of skill in the art that various modifications can be made within the spirit and scope of the present invention. For example, while the monocrystalline contacts in this embodiment have been silicon, any semiconductor material, such as germanium, may be used. Germanium single crystal layers can be used when the temperatures for the subsequent wafer processing are lower than the melting point of germanium (936° C.). The formation of monocrystalline semiconductor layers is also applicable for other device applications such as formation of three-dimensional device architectures. Further, while transistors have been illustrated as the semiconductor devices it should be understood that any semiconductor device, e.g. diodes, resistors, etc., might be contacted in this fashion.

FIGS. 6A–E show partial cross-sections through semiconductor devices, similar to those in FIGS. 2–5, at different stages of fabrication and according to a further embodiment of the invention in which the polylayers used for the sidewall contacts of the pillar transistor are made from a composite semiconductor with different and lower melting temperature than the substrate. This embodiment also includes the use of Ge sidewall contact layers as described above.

Referring to FIG. 6A, single crystal semiconductor substrate 60 of, for example, silicon has formed thereon dielectric layer 62, polycrystalline semiconductor layer 64 and dielectric layer 66. Dielectric layers 62, 66 are analogous to layers 34, 38 of FIG. 2 and may be, for example, of silicon dioxide. Other dielectric materials may also be used. Examples are silicon nitride, silicon oxy-nitride and silicon oxide-silicon nitride sandwiches. Such layers are prepared by means well known in the art. Low pressure chemical vapor deposition is a convenient and well known technique. Typical thicknesses for layers 62, 64, 66 are similar to layers 34, 36, 38, but thicker and thinner layers may also be used.

In this embodiment, polycrystalline semiconductor layer 64 must be of a material having a melting point below that of single crystal substrate 60. As has been previously noted, germanium is a suitable semiconductor material for layer 64. Its melting point (936° C.) is substantially below that of silicon (1412° C.). While substantially pure germanium is useful, germanium-silicon mixtures are particularly convenient. High concentrations of conventional conductivity altering dopants are used in either case to render the Ge, Si, or Ge-Si alloy highly conductive so as to minimize in so far as is practical the series resistance of the sidewall contact layer. Very high concentrations of conductivity altering dopants, e.g., $10^{20}/cm^3$ or more can also lower the melting point of the doped material compared to the undoped material. In silicon for example, the lowering of the melting point due to such very high concentrations of conductivity altering dopants is about 10°–15° C..

The following table illustrates how the melting point of Ge-Si alloys varies as a function of the silicon concentration, in atomic percent.

| MELTING POINT OF Ge—Si ALLOYS AS A FUNCTION OF SILICON CONCENTRATION | |
|---|---|
| ATOMIC % Si | MELTING POINT (°C.) |
| 0.0 | 936 |
| 2.5 | 960 |
| 5.0 | 1000 |
| 7.5 | 1025 |
| 10.0 | 1050 |
| 12.5 | 1065 |
| 15.0 | 1080 |
| 17.5 | 1100 |
| 20.0 | 1125 |
| 100.0 | 1412 |

By choosing the appropriate amount of silicon to include in the Ge-Si alloy used to form polylayer 64, the melting point of polylayer 64 can be adjusted over a wide temperature range, e.g., several hundred degrees centigrade, below the melting point of silicon substrate 60.

It is essential that the melting point of the polylayer be lower than the melting point of the substrate. It is desirable that the melting point of the polylayer be at least 50° C. lower, preferably, at least 100° C. lower, with about 200° C. lower being typical. This may be accomplished by doping or alloying or a combination thereof.

Ge-Si alloy polylayers, for example, are deposited on dielectric layer 62 using means well known in the art. Chemical vapor deposition is a well known technique, but other techniques well known in the art such as sputtering or vacuum evaporation may also be used. Chemical vapor deposition is preferred. The Ge-Si proportions are varied, for example, by varying the temperature and/or relative proportions of the source gases during chemical vapor deposition. Those of skill in the art will understand based on the description herein how to deposit layers of varying composition.

The ability to select the melting point of the polylayer material is particularly advantageous because it allows the process designer to choose a material for polycrystalline layer 64 that has a melting point lower than that of substrate 60 but still above the temperature required for subsequent device processing after recrystallization of layer 64, e.g., doping of the Si epi-pillar. It is also desirable to be able to adjust the melting point by means other than the use of very high concentrations of conductivity altering dopants, since other device or process considerations may limit the useful amount of conductivity altering dopant which can be included. However, use of such highly doped polylayers is not precluded.

Using a doped alloy of two semiconductors for the sidewall contact layers, such as for example Ge-Si, permits the melting point and conductivity level to be adjusted independently. For example, a decrease in melting point due to high doping for high conductivity can be compensated by slightly increasing the concentration of the higher melting point semiconductor, e.g., the silicon in the Ge-Si alloy. This flexibility is a substantial advantage.

A further advantage of the use of Ge or Ge-Si alloy on Si (or other equivalent material or lower melting point on other single crystal substrates) is that layer 64 may be recrystallized to form single crystal layer 64' (see FIG. 6C) without risk of melting substratee 60. It is not necessary to have a temperature gradient across layers 62–66 such that layer 64 is above the melting point of substrate 60 while substrate 60 remains cooler as is the case where substrate 60 and layer 64 are of the same material, e.g., both of Si. A conventional semiconductor processing furnace or reactor may be used for the recrystallization process. The vacuum enclosure and scanned strip heater commonly used for the poly Si-single crystal Si system of FIG. 1 are not necessary. Further, recrystallization may be accomplished at much lower temperatures. Accordingly, the manufacturing process is substantially simplified.

A further advantage of using Ge or Ge-Si alloys for poly layer 64 is that for the same doping level they have the same or lower resistivity than silicon. Thus, recrystallized Ge or Ge-Si alloys are expected to provide lower overall contact resistance than can be obtained conveniently with pure silicon alone.

A still further advantage of using Ge or Ge-Si alloy for poly layer 64 is that the recrystallization and epi-growth steps may be combined. This is not practicable where layer 64 is of lightly doped silicon. When polysilicon is used for the sidewall contacts to a silicon pillar, it is desirable to recrystallize the polylayer before the well or trench is etched through the oxide-polyoxide sandwich to the substrate (see FIGS. 1-4). When Ge or Ge-Si alloy is used for layer 64 above a monocrystalline silicon substrate, the recystallization step need not be performed before growing the epi-pillar. This is illustrated in FIGS. 6A-C.

In FIG. 6A, an oxide-poly-oxide sandwich (layer 62, 64, 66) using a Ge or Ge-Si alloy is formed on substrate 60. Trench or well 68 is then etched through the sandwich to expose a portion of substrate 60 (see FIG. 6B). The substrate is then placed in a conventional epi reactor for growth of single crystal epi region 70 in opening 68 (see FIG. 6C). The epi deposition temperature is chosen so as to be slightly above the melting point of the material used for layer 64. Silicon epi deposition temperatures in the range 900°-1300° C., preferably 1000°-1200° C., are commonly used and means for such deposition are well known in the art.

Layer 64 is molten during the growth of epi pillar 70. Molten layer 64 remains between oxide layer 62, 66, held in place by surface tension. Polycrystalline nucleation 24 (see FIG. 1) encountered with the conventional polysilicon sidewall contact and silicon pillar process, does not occur when sidewall contact material 64 is molten. Rather than have a solid polysilicon sidewall contact disturb the growing pillar material, the growing pillar material in FIG. 6C orients and seeds the molten Ge or Ge-Si sidewall contact material.

Once growth of epi-pillar 70 is complete and the substrate and layers are cooling, the portions of layer 64 in contact with pillar 70 will solidify first and will become monocrystalline, seeded by pillar 70. This is because the latent heat of freezing must be extracted from layer 64 before solidification can take place. Compared to single crystal pillar 70, dielectric layers 62, 66 are relative thermal insulators. Thus, the region of layer 64 in contact with pillar 70 will cool more rapidly and solidify first. As indicated by arrows 71, solidification will proceed outwardly from pillar 70, seeded by pillar 70. This provides substantially uniform orientation of recrystallized layer 64' around pillar 70. This is a method and result unrecognized in the prior art and is only possible using a sidewall contact material with a lower melting temperature than the substrate.

FIG. 6D shows the structure of FIG. 6C after completion of doping steps to provide emitter region 72, base region 74, and collector region 76 in pillar 70. Means and methods for providing such doped regions are well known in the art.

FIG. 6E illustrates a structure similar to that in FIG. 6D and analogous to FIG. 5, but with additional Ge or Ge-Si alloy layer 88 (are recrystallized sidewall contact 88') and dielectric layer 90, so that separate sidewall contacts are provided to base region 74 and collector region 76. Additional polylayer 88 and dielectric layer 90 are formed in the same way as polylayer 64 and dielectric layer 66. Recrystallized sidewall contact 88' is formed in the same manner as recrystallized sidewall contact 44 and 64'.

As those of skill in the art will appreciate based on the description herein, Ge or Ge-Si alloy polylayer 64 could, alternatively, be recrystallized after growth of epi-pillar 70. In this situation, the poly alloy would be chosen to have a melting temperature above the temperature for forming epi-pillar 70 but below the substrate melting temperature. The layer sandwich would be formed as before, the well etched, the epi-pillar grown, and then the structure heated to a temperature above the alloy melting temperature and thereafter cooled as before so that recrystallization of layer 64 and/or 66 is seeded by pillar 70. However, the procedure described earlier where the polylayer is molten during epi growth is preferred because there is less tendency for polycrystalline regions to nucleate at the sidewall contacts during epi growth.

The means and method described in connection with FIGS. 2-5 and 6A-E provide a sidewall contact transistor that has lower sidewall contact resistance than has been practical in the prior art, that is particularly easy to manufacture, that has sidewall contact materials compatible with further device processing, and that yields improved crystal quality in the epi-pillar. The melting temperature of the poly sidewall contact materials may be adjusted to suit the requirements of subsequent processing. Temperature gradient recrystallization is not required and ordinary furnaces and epi-reactors operating at much lower temperatures may be used. There is no danger of melting the substrate and the substrate warpage and cracking problems associated with operating very close to the substrate melting temperature (as in the prior art) are avoided. Further, poly nucleation at the sidewall contacts is avoided.

Thus, while we have shown and described specific embodiments of this invention, further modifications and improvements will occur to those skilled in the art based on the teachings herein.

For example, even though it is more convenient to perform the epitaxial pillar growth while the surface of the substrate is solid, the structure may also be prepared by forming the pillar on a locally molten region of the substrate, or by depositing the pillar in polycrystalline form and then locally heating the pillar above its melting point while maintaining the sidewall contact layer also above its melting point and then cooling the assemblage so that the molten pillar zone recrystallizes, seeded by the still solid substrate and in turn seeds the recrystallization of the lower melting sidewall contact material. Laser heating is an example of a method that may be used to locally heat particular regions of a semiconductor substrate above the melting point while the bulk of the substrate remains solid. Means and methods for performing local heating with lasers are described for example in U.S. Pat. No. 4,343,832, which is incorporated herein by reference. Accordingly, it is not intended that this invention be limited to the particular form shown and we intend in the appended claims to cover all modifications which do not depart from the spirit and scope of this invention.

We claim:

1. A method for forming semiconductor devices, comprising:
   providing a monocrystalline semiconductor substrate having a first melting temperature;
   forming a first dielectric layer on the substrate;
   forming a first polycrystalline semiconductor layer having a second melting temperature less than the first melting temperature on the first dielectric layer;
   forming a second dielectric layer on the first polycrystalline semiconductor layer;
   forming an opening extending through the first and second dielectric layers and the first polycrystalline semiconductor layer to the substrate; and
   during a single heating-cooling cycle, depositing a single crystal semiconductor region on the substrate in the opening, melting the polycrystalline semiconductor layer, and cooling the polycrystalline semiconductor layer below the second melting temperature while in contact with the semiconductor region formed in the opening.

2. The method of claim 1 wherein the steps of depositing the semiconductor region on the substrate, melting, and cooling the polycrystalline semiconductor layer, comprise recrystallizing at least part of the first polycrystalline layer progressively laterally outward from the opening.

3. The method of claim 1 wherein the substrate comprises silicon and the first polycrystalline semiconductor layer comprises germanium.

4. The method of claim 1 wherein the step of melting the polycrystalline semiconductor layer comprises heating to above the second melting temperature and below the first melting temperature.

5. A method for forming semiconductor devices, comprising:
providing a monocrystalline semiconductor substrate having a first melting temperature;
forming a first dielectric layer on the substrate;
forming a first polycrystalline semiconductor layer having a second melting temperature less than the first melting temperature and on the first dielectric layer;
forming a second dielectric layer on the first polycrystalline semiconductor layer;
forming an opening extending through the first and second dielectric layers and the first polycrystalline semiconductor layer to the substrate;
at least partly filling the opening with a single crystal semiconductor material having a third melting temperature greater than the second melting temperature and in contact with the substrate and the first polycrystalline semiconductor layer; and
during or after the filling step, recrystallizing at least part of the first polycrystalline semiconductor layer by melting the polycrystalline semiconductor layer as a whole and thereafter cooling so as to resolidify the melted semiconductor layer in a region laterally adjacent the opening before resolidfying in a region laterally removed from the opening.

6. The method of claim 5 wherein the steps of recrystallizing, melting, and thereafter cooling at least part of the first polycrystalline layer comprise recrystallizing the layer epitaxially from the semiconductor material in the opening.

7. The method of claim 5 wherein the step of at least partly filling the opening with a semiconductor material comprises heating the substrate to a temperature exceeding the second melting temperature.

8. The method of claim 5 wherein the step of at least partly filling the opening with a semiconductor material comprises heating the substrate to a temperature less than the second melting temperature.

9. A method for forming semiconductor devices, comprising:
providing a monocrystalline semiconductor substrate having a first melting temperature;
forming a first dielectric layer on the substrate;
forming a first polycrystalline semiconductor layer having a second melting temperature less than the first melting temperature on the first dielectric layer;
forming a second dielectric layer on the first polycrystalline semiconductor layer;
forming an opening extending through the first and second dielectric layers and the first polycrystalline semiconductor layer to the substrate;
at least partly filling the opening within a single crystal semiconductor material having a third melting temperature greater than the second melting temperature and in contact with the substrate and the first polycrystalline semiconductor layer by forming a polycrystalline semiconductor material in the opening and thereafter heating and cooling to recrystallize the semiconductor material in the opening;
during or after the filling step, recrystallizing at least part of the first polycrystalline semiconductor layer by heating to a temperature greater than the second melting temperature; and
thereafter cooling.

10. The method of claim 9 wherein the heating and cooling step further comprises recrystallizing a portion of the first polycrystalline layer in contact with the semiconductor material.

* * * * *